(12) United States Patent
Jeong et al.

(10) Patent No.: US 12,090,642 B2
(45) Date of Patent: Sep. 17, 2024

(54) DIE PICKUP MODULE AND DIE BONDING APPARATUS INCLUDING THE SAME

(71) Applicants: SEMES CO., LTD., Chungcheongnam-do (KR); SAMSUNG ELECTRONICS CO., LTD., Gyeonggi-do (KR)

(72) Inventors: Chang Bu Jeong, Gyeonggi-do (KR); Jong Sung Park, Gyeonggi-do (KR); Jung Sub Kim, Chungcheongnam-do (KR); Young Gun Park, Chungcheongnam-do (KR); Dae Seok Choi, Chungcheongnam-do (KR); Sang Hoon Jung, Chungcheongnam-do (KR); Min Gu Lee, Chungcheongnam-ro (KR); Eui Sun Choi, Seoul (KR); Kang San Lee, Gyeonggi-do (KR); Dae Ho Min, Seoul (KR); Seung Dae Seok, Gyeonggi-do (KR)

(73) Assignees: SEMES CO., LTD., Chungcheongnam-do (KR); SAMSUNG ELECTRONICS CO., LTD, Gyeonggi-do (KR)

( * ) Notice: Subject to any disclaimer, the term of this patent is extended or adjusted under 35 U.S.C. 154(b) by 971 days.

(21) Appl. No.: 17/002,008

(22) Filed: Aug. 25, 2020

(65) Prior Publication Data
US 2021/0060798 A1    Mar. 4, 2021

(30) Foreign Application Priority Data
Aug. 27, 2019    (KR) ........................ 10-2019-0105301

(51) Int. Cl.
B25J 15/06    (2006.01)
B65G 47/91    (2006.01)

(52) U.S. Cl.
CPC ......... *B25J 15/0616* (2013.01); *B65G 47/911* (2013.01); *B65G 2249/045* (2013.01)

(58) Field of Classification Search
CPC ............... B25J 15/0616; B65G 47/911; B65G 2249/045; H01L 21/6732; H01L 21/6838; H01L 21/68714
See application file for complete search history.

(56) References Cited

U.S. PATENT DOCUMENTS

| 4,494,902 | A | * | 1/1985 | Kuppens | ................. | H01L 21/67 221/25 |
| 4,990,051 | A | * | 2/1991 | Safabakhsh | .......... | H05K 13/021 156/707 |

(Continued)

FOREIGN PATENT DOCUMENTS

| JP | 05277977 A | 10/1993 |
| KR | 101600382 B1 | 3/2016 |

(Continued)

*Primary Examiner* — Saul Rodriguez
*Assistant Examiner* — Brendan P Tighe
(74) *Attorney, Agent, or Firm* — Buchanan Ingersoll & Rooney PC

(57) ABSTRACT

Provided are a die pickup module and a die bonding apparatus including the same. The die pickup module includes a wafer stage for supporting a wafer including dies attached on a dicing tape, a die ejector arranged under the dicing tape and for separating a die to be picked up from the dicing tape, a non-contact picker for picking up the die in a non-contact manner so as not to contact a front surface of the die, a vertical driving unit for moving the non-contact picker in a vertical direction to pick up the die and an inverting driving unit for inverting the non-contact picker to invert a die picked up by the non-contact picker.

15 Claims, 14 Drawing Sheets

(56) References Cited

U.S. PATENT DOCUMENTS

| | | | |
|---|---|---|---|
| 5,169,196 A | 12/1992 | Safabakhsh | |
| 6,039,833 A * | 3/2000 | Freund | H01L 21/6838 156/707 |
| 7,305,757 B2 * | 12/2007 | Gaunekar | H01L 21/67132 29/739 |
| 7,665,204 B2 * | 2/2010 | Cheung | H01L 21/67132 156/716 |
| 9,656,368 B2 | 5/2017 | Kim et al. | |
| 2002/0046460 A1 * | 4/2002 | Mimata | H01L 24/75 29/840 |
| 2015/0321321 A1 * | 11/2015 | Kim | B24B 41/005 269/21 |
| 2020/0114524 A1 | 4/2020 | DePetris et al. | |

FOREIGN PATENT DOCUMENTS

| | | |
|---|---|---|
| KR | 20190009510 A | 1/2019 |
| KR | 20190034858 A | 4/2019 |
| KR | 20190054748 A | 5/2019 |
| WO | 2018099615 A1 | 6/2018 |

* cited by examiner

[FIG. 1]
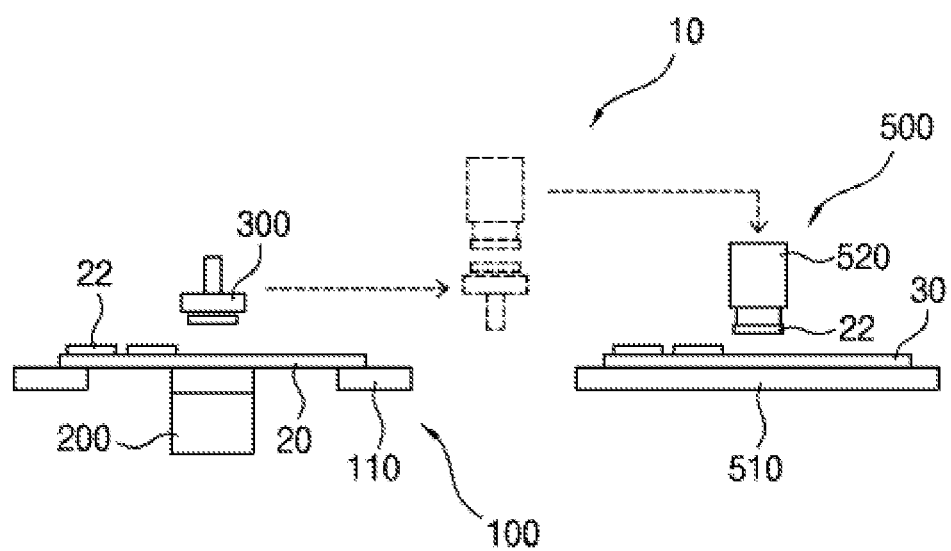

[FIG. 2]
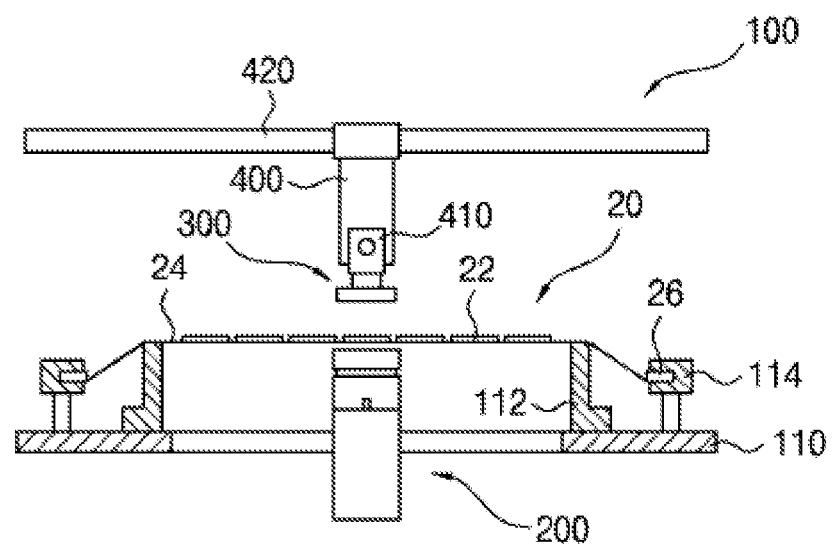

[FIG. 3]
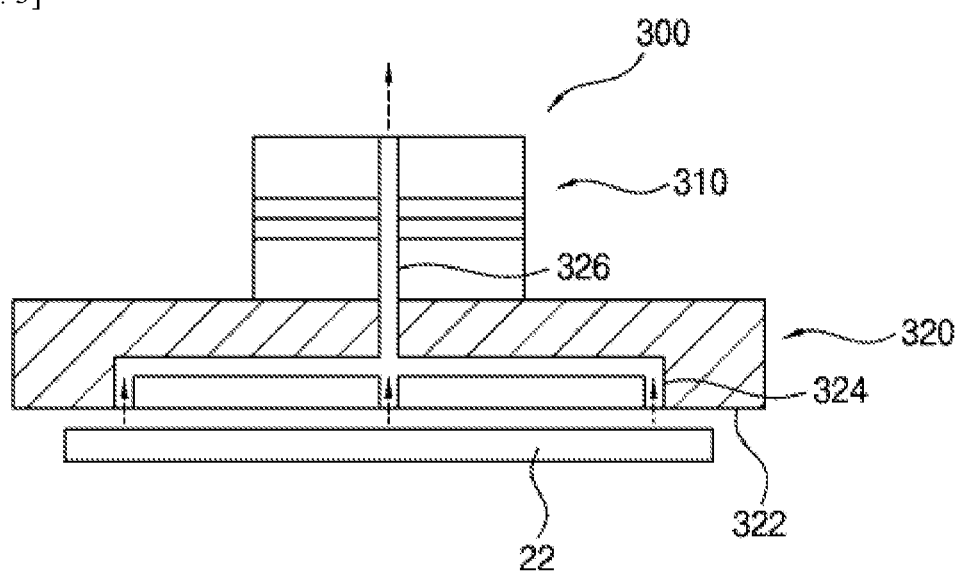

[FIG. 4]
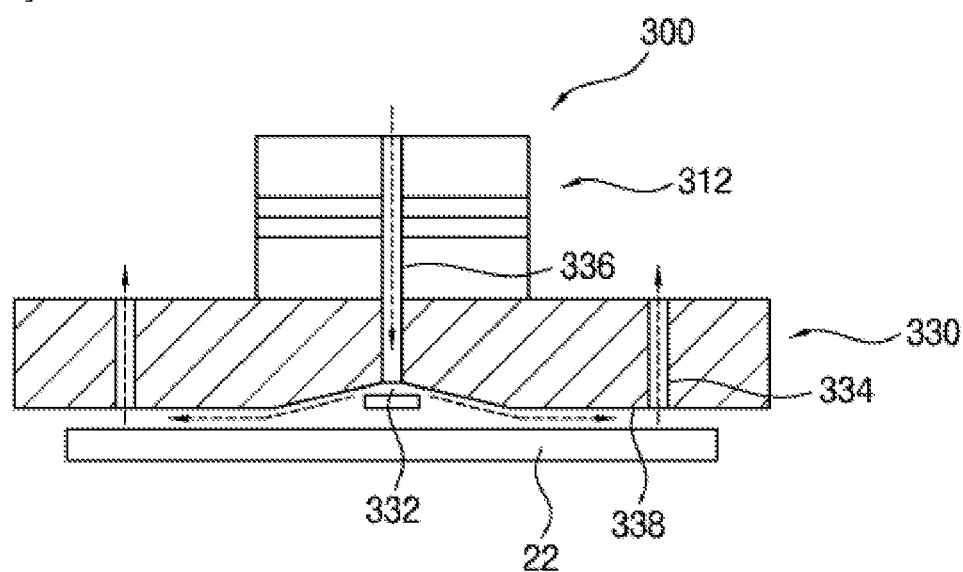

[FIG. 5]
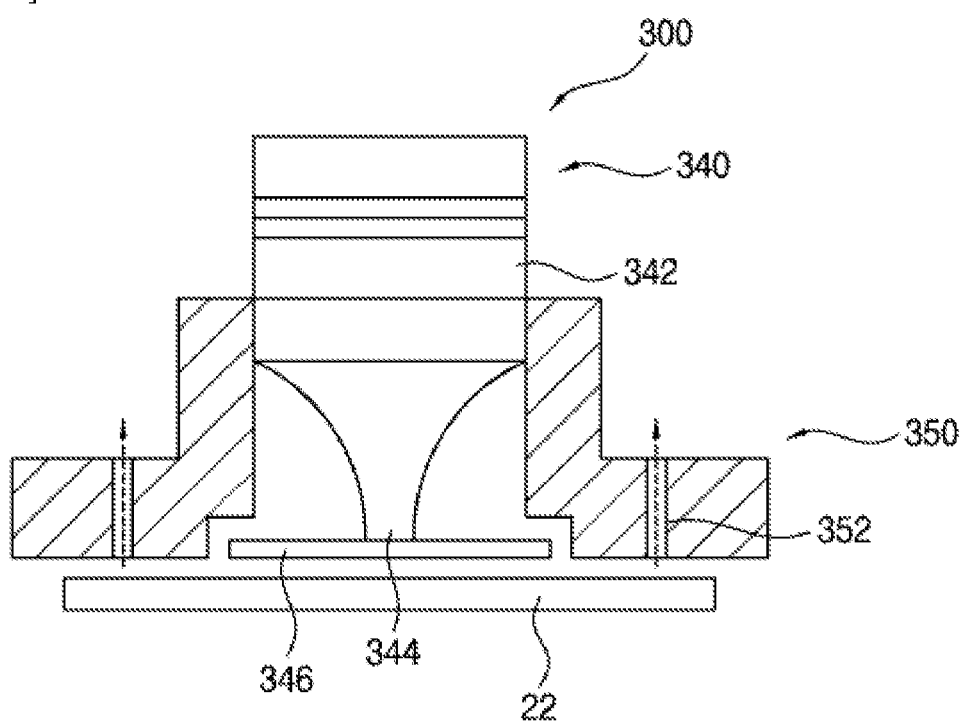

[FIG. 6]
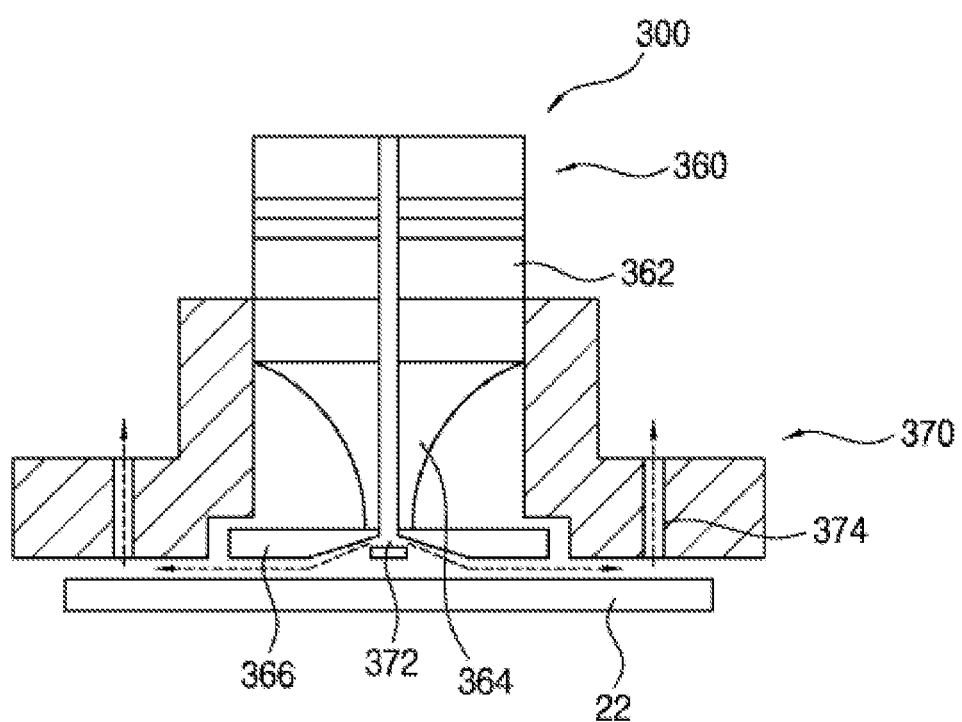

[FIG. 7]
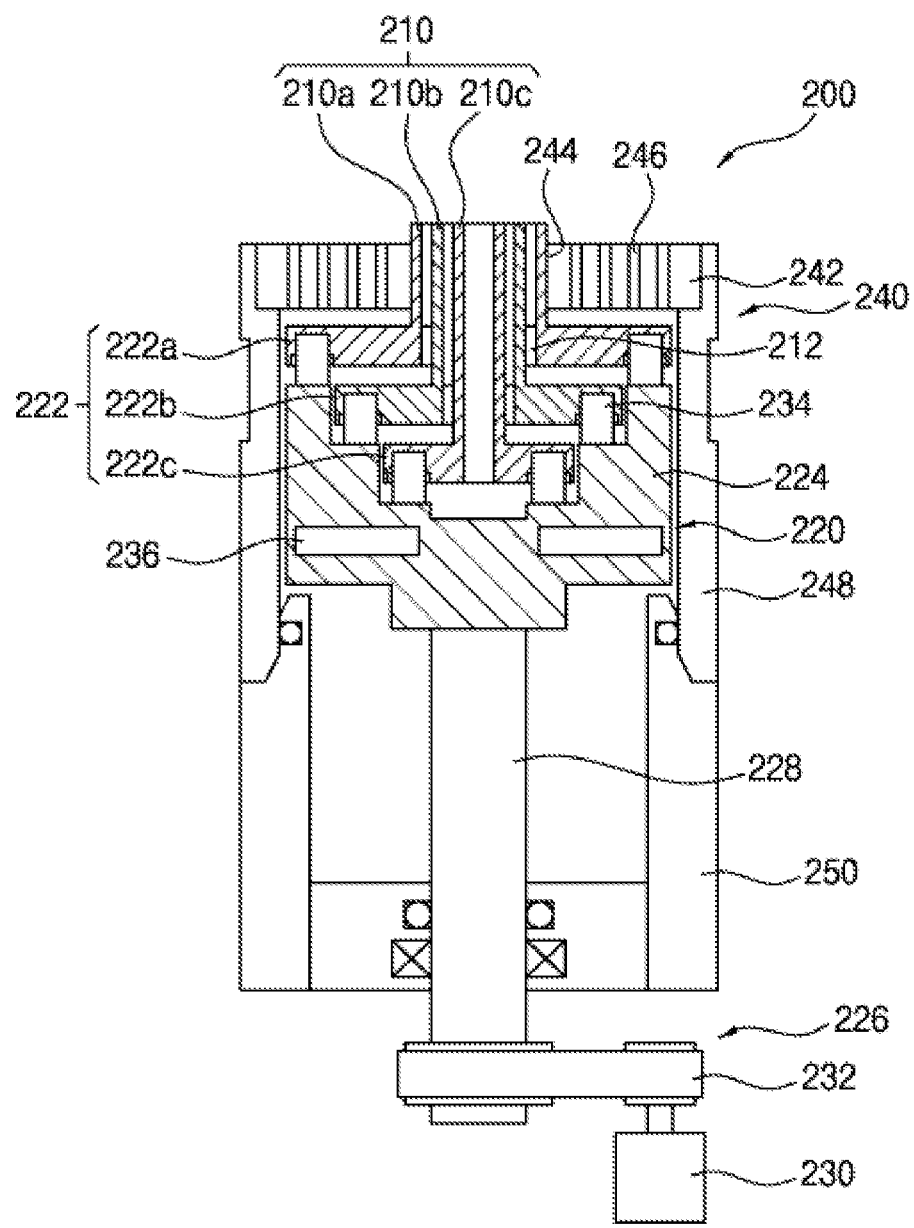

[FIG. 8]
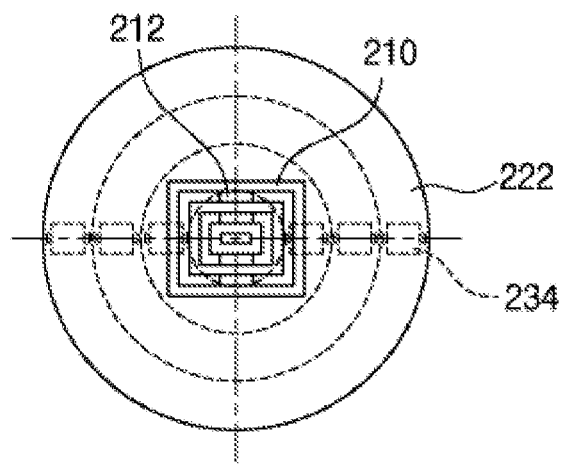

[FIG. 9]
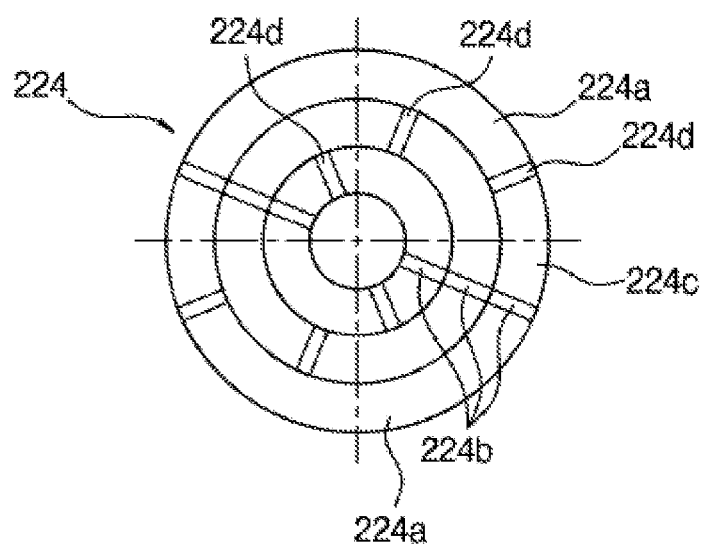

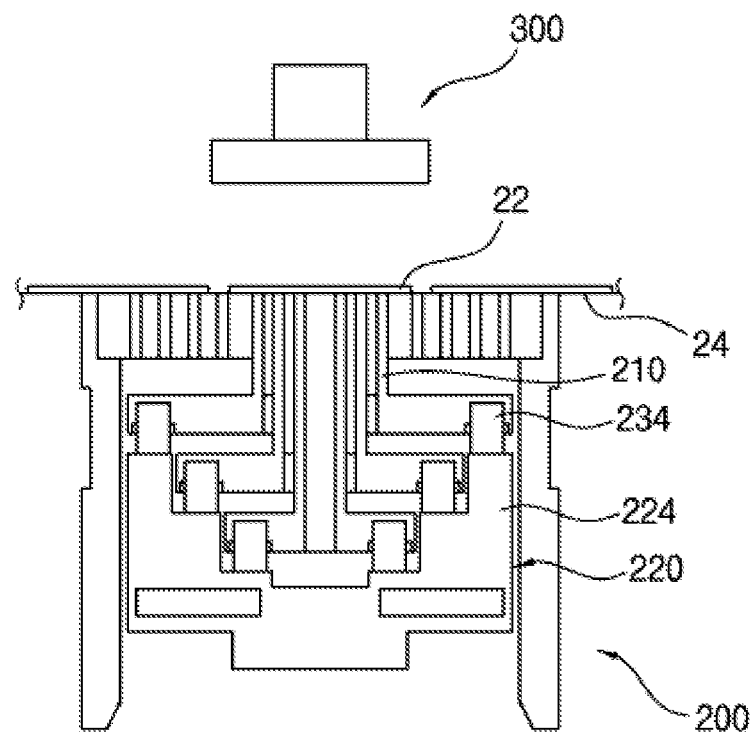
[FIG. 10]

[FIG. 11]
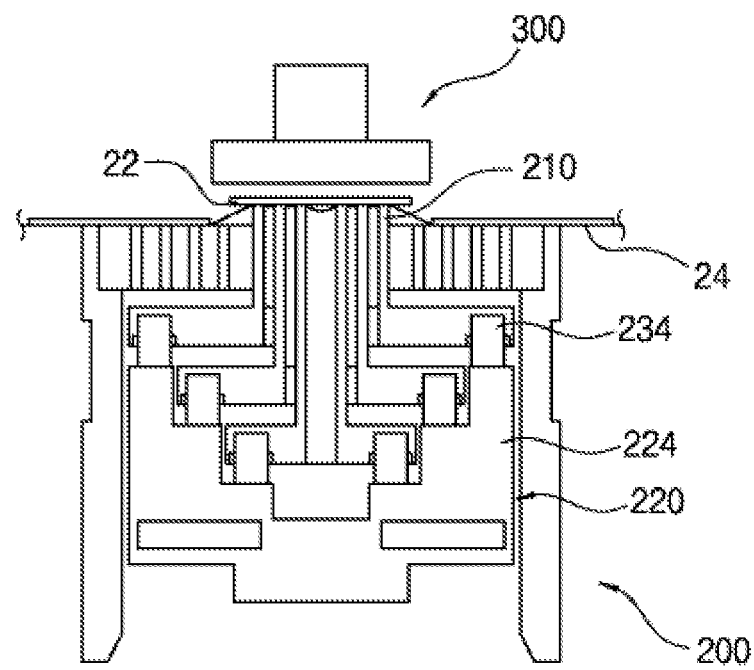

[FIG. 12]
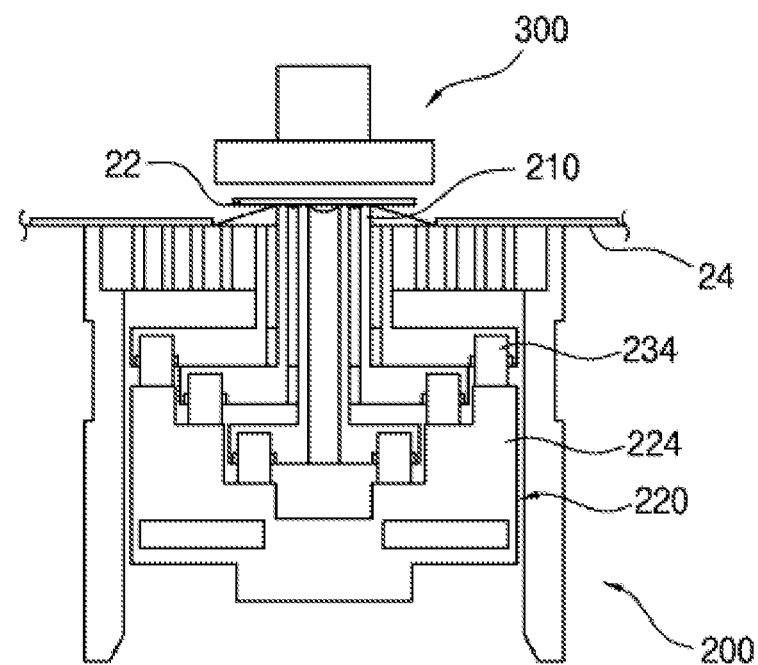

[FIG. 13]
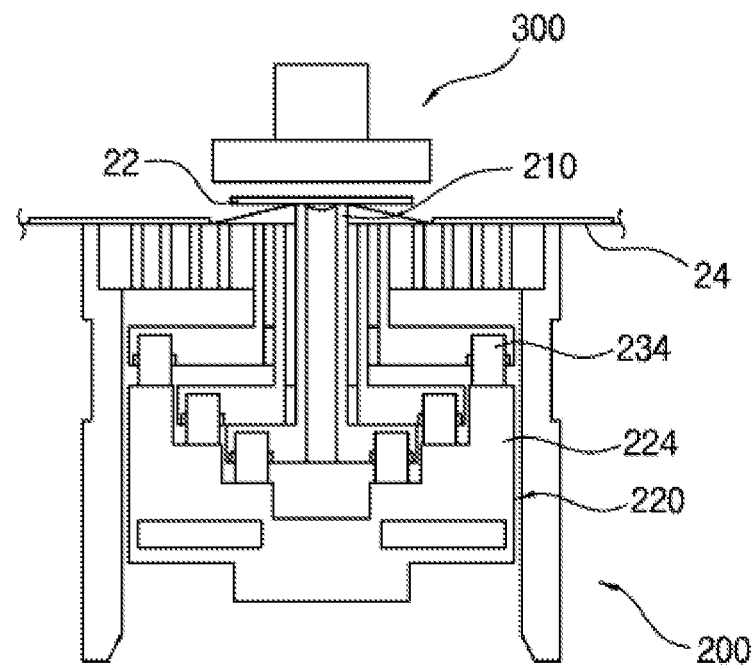

[FIG. 14]
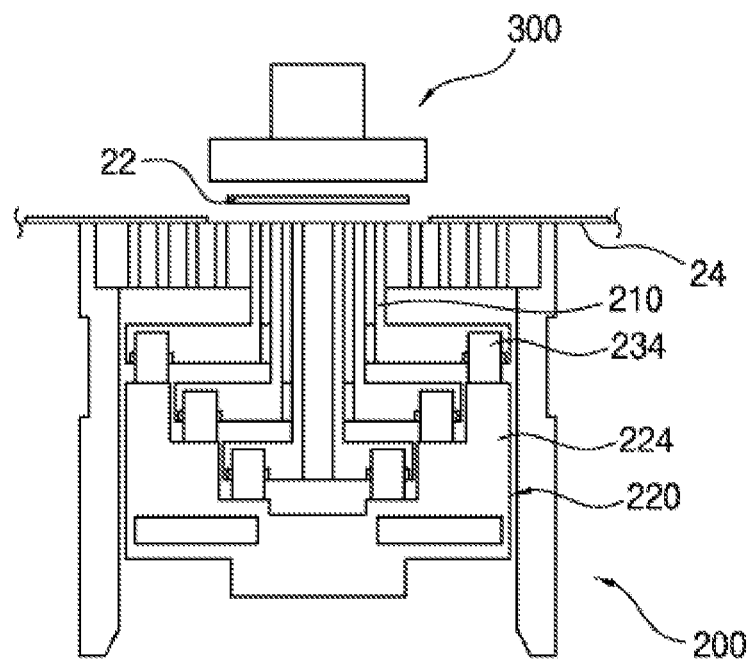

DIE PICKUP MODULE AND DIE BONDING APPARATUS INCLUDING THE SAME

CROSS-REFERENCE TO RELATED APPLICATIONS

This patent application claims the benefit of Korean Patent Application No. 10-2019-0105301, filed on Aug. 27, 2019, which is hereby incorporated by reference in its entirety into this application.

BACKGROUND

1. Field

The present invention relates to a substrate processing apparatus.

2. Description of the Related Art

Embodiments of the present invention relates to a die pickup module and a die bonding apparatus including the same. More particularly, the present invention relates to a die pickup module for picking up a die attached on a dicing tape in a manufacturing process of a semiconductor device, and a die bonding apparatus for bonding a die picked up by the die pickup module on a substrate.

In general, semiconductor devices can be formed on a silicon wafer used as a semiconductor substrate by repeatedly performing a series of manufacturing processes. The wafer, on which the semiconductor elements are formed, can be individualized into a plurality of dies through a dicing process, and the individualized dies through the dicing process can be bonded on a substrate such as a lead frame, a printed circuit board, and a semiconductor wafer through a die bonding process.

The apparatus for performing the die bonding process may comprise a die pickup module for picking up and separating the dies from the wafer divided into the dies, and a die bonding module for attaching the picked up die on a substrate. The die pickup module may include a stage unit for supporting the wafer and a die ejector for selectively separating a die from the wafer supported on the stage unit, and a picker for picking up the die from the wafer and transmitting it to the die bonding module. The die bonding module may include a substrate stage for supporting the substrate and a bonding head for vacuum adsorbing the die and bonding it on the substrate.

Recently, as the degree of integration of semiconductor devices increases, the pad pitch on the die is gradually decreasing, and the problem that the front surface portion of the die bonded on the substrate is contaminated in the die bonding process has emerged as a problem to be solved. In particular, in the case of a through silicon via (TSV) bonding process for manufacturing a stacked semiconductor device, a plurality of electrode pads may be arranged on the front surface of the die, and contamination caused by contact in the process of being picked up from the wafer by the picker may occur.

PRIOR ART (Patent 1) Korean Patent Publication No. 10-2019-0034858 (publication date: Apr. 3, 2019)

SUMMARY

The object of the embodiments of the present invention is to provide a multivalent pickup module capable of preventing contamination of a die in a die pickup process and a die bonding apparatus including the same.

A die pickup module according to an aspect of the present invention for achieving the above object may comprise a wafer stage for supporting a wafer including dies attached on a dicing tape, a die ejector arranged under the dicing tape and for separating a die to be picked up from the dicing tape, a non-contact picker for picking up the die in a non-contact manner so as not to contact a front surface of the die, a vertical driving unit for moving the non-contact picker in a vertical direction to pick up the die and an inverting driving unit for inverting the non-contact picker to invert a die picked up by the non-contact picker.

According to some embodiments of the present invention, the non-contact picker may include an ultrasonic vibration unit for maintaining the die in a non-contact state using ultrasonic vibration.

According to some embodiments of the present invention, the non-contact picker may include an ultrasonic vibration unit for providing repulsive force to push the die using ultrasonic vibration and a vacuum chuck for providing suction force to the die using a vacuum pressure so that the die is maintained in a non-contact state.

According to some embodiments of the present invention, the non-contact picker may include an ultrasonic vibration unit for providing repulsive force to push the die using ultrasonic vibration and a Bernoulli chuck for forming a flow of air on the die so as to maintain the die in a non-contact state and providing suction force to the die using negative pressure generated by the flow of air.

According to some embodiments of the present invention, the ultrasonic vibration unit may include an ultrasonic vibrator for generating the ultrasonic vibration, a horn for transmitting the ultrasonic vibration and a vibration plate connected to the horn and vibrated by the ultrasonic vibration.

According to some embodiments of the present invention, the vacuum chuck is coupled to an end of the ultrasonic vibration unit and has vacuum holes for forming the suction force, and the vacuum holes may be connected to a vacuum pump through a vacuum line passing through the ultrasonic vibration unit.

According to some embodiments of the present invention, the Bernoulli chuck is coupled to an end of the ultrasonic vibration unit and has an air injection nozzle for forming the flow of air and vacuum holes for sucking air injected from the air injection nozzle, and the air injection nozzle may be connected to an air supplying unit for supplying the air through an air line passing through the ultrasonic vibration unit According to some embodiments of the present invention, the die ejector may include ejector members arranged in a telescope shape and an ejector driving unit for simultaneously raising the ejector members and sequentially descending the ejector members one by one from outside to inside.

According to some embodiments of the present invention, the ejector driving unit may include disc-shaped flanges each formed in a horizontal direction in a lower end portion of the ejector members, arranged in a vertical direction, and having a diameter gradually increasing upward, a driving head arranged in a lower portion of the flanges and having a circular ring shaped upper surfaces respectively facing lower surfaces of the flanges, a head driving unit for rotating the driving head, and cam followers mounted in a lower portion of the flanges and placed on upper surfaces of the driving head, and the upper surfaces of the driving head may have first inclined surfaces for simultaneous rise of the ejector members and second inclined surfaces for sequential descend of the ejector members.

According to some embodiments of the present invention, the driving head may include a permanent magnet for providing a magnetic force so that the cam followers are in close contact with upper surfaces of the driving head.

According to some embodiments of the present invention, the die ejector may further include a stopper member for maintaining a gap between the ejector members.

According to some embodiments of the present invention, the die ejector may further include a hood having an opening, into which the ejector members are inserted, and vacuum holes for vacuum adsorbing the dicing tape, and an ejector body coupled to the hood and in a cylinder shape with a closed lower portion.

A die bonding apparatus according to another aspect of the present invention for achieving the above object may include a die pickup module for picking up a die to be picked up from a wafer including dies attached on a dicing tape and inverting the picked up die, and a die bonding module for bonding a die inverted by the die pickup module on a substrate, wherein the die pickup module may include a wafer stage for supporting the wafer; a die ejector arranged under the dicing tape and for separating the die from the dicing tape, a non-contact picker for picking up the die in a non-contact manner so as not to contact a front surface of the die, a vertical driving unit for moving the non-contact picker in a vertical direction to pick up the die, and an inverting driving unit for inverting the non-contact picker to invert the die so that a rear surface of the die picked up by the non-contact picker faces upward.

According to the embodiments of the present invention as described above, the non-contact picker may pick up the die in a non-contact manner using the repulsive force provided by the ultrasonic vibration unit and the suction force provided by the vacuum chuck or the Bernoulli chuck. And then the inverting driving unit may invert the picked up die. The bonding head may pick up the rear surface of the inverted die by vacuum adsorption, and perform a bonding step such that the front surface of the die is attached onto the substrate. By picking up the die in a non-contact manner as described above, contamination of the front surface of the die can be prevented, and thus, bonding failure due to contamination of the front surface of the die or electrical defects between the electrode pads due to contamination can be sufficiently prevented.

BRIEF DESCRIPTION OF THE DRAWINGS

FIG. 1 is a schematic diagram for describing a die pickup module and a die bonding apparatus including the same according to an embodiment of the present invention.

FIG. 2 is a schematic diagram for describing the die pickup module shown in FIG. 1.

FIG. 3 is a schematic cross-sectional view for describing an example of the non-contact picker shown in FIG. 2.

FIG. 4 is a schematic cross-sectional view for describing another example of the non-contact picker shown in FIG. 2.

FIG. 5 is a schematic cross-sectional view for describing another example of the non-contact picker shown in FIG. 2.

FIG. 6 is a schematic cross-sectional view for describing another example of the non-contact picker shown in FIG. 2.

FIG. 7 is a schematic cross-sectional view for describing the die ejector shown in FIG. 2.

FIG. 8 is a schematic plan view for describing the ejector members and flanges shown in FIG. 7.

FIG. 9 is a schematic plan view for describing the driving head shown in FIG. 7.

FIGS. 10 to 14 are schematic diagrams for describing a method of picking up a die using the non-contact picker and the die ejector shown in FIG. 2.

DETAILED DESCRIPTION

Hereinafter, embodiments of the present invention will be described in detail with reference to the accompanying drawings. However, the present invention should not be configured as limited to the embodiments described below, but may be embodied in various other forms. The following embodiments are provided to sufficiently convey the scope of the present invention to those skilled in the art of the present invention rather than to make the present invention to be wholly completed.

In the embodiments of the present invention, when one element is described as being arranged on or connected to another element, the element may be arranged or connected directly on the other element, and other elements may be interposed between them. Alternatively, if one element is described as being arranged or connected directly on the other element, there cannot be another element between them. Terms such as first, second, third, etc. may be used to describe various items such as various elements, compositions, regions, layers and/or parts, but the items are not limited by these terms.

The terminology used in the embodiments of the present invention is used for the purpose of describing specific embodiments only, and is not intended to limit the present invention. Further, unless limited otherwise, all terms including technical and scientific terms have the same meaning that can be understood by those of ordinary skill in the art. These terms, such as those defined in conventional dictionaries, will be construed to have meanings consistent with their meanings in the context of the description of the invention and the related art, it will not be interpreted ideally or excessively intuition, unless explicitly defined.

Embodiments of the invention are described with reference to schematic diagrams of ideal embodiments of the invention. Accordingly, changes from the shapes of the diagrams, for example, changes in manufacturing methods and/or tolerances, can be expected sufficiently. Accordingly, the embodiments of the present invention are not limited to specific shapes of regions described as diagrams, but include variations in shapes, and the elements described in the diagrams are entirely schematic and their shapes are not intended to describe the exact shape of the elements and are not intended to limit the scope of the invention.

FIG. 1 is a schematic diagram for describing a die pickup module and a die bonding apparatus including the same according to an embodiment of the present invention, and FIG. 2 is a schematic diagram for describing the die pickup module shown in FIG. 1.

Referring to FIGS. 1 and 2, the die pickup module 100 and the die bonding apparatus 10 including the same according to an embodiment of the present invention can be used to pick up dies 22 individualized by a dicing process in a manufacturing process of a semiconductor device and bond them on a substrate 30 such as a lead frame, printed circuit board, semiconductor wafer, or the like.

The die bonding apparatus 10 may include the die pickup module 100 for picking up the die 22 to be picked up from the wafer 20 including the dies 22 and inverting the picked up die 22 and a die bonding module 500 for bonding the die 22 inverted by the die pickup module 100 on the substrate 30.

The wafer 20 may include dies 22 individualized by a dicing process, and the dies 22 may be provided attached to the dicing tape 24. In particular, the dies 22 may have a rear surface of the dies 22 attached to the dicing tape 24 such that the front surface faces upward, and the dicing tape 24 can be mounted to the mount frame 26 having a substantially circular ring shape.

The die pickup module 100 may comprise a wafer stage 110 for supporting a wafer 20, a die ejector 200 arranged under the dicing tape 24 and for separating the die 22 from the dicing tape 24, a non-contact picker 300 for picking up the die in a non-contact manner so as not to contact a front surface of the die 22 for preventing contamination of the front surface portion of the die 22, a vertical driving unit 400 for moving the non-contact picker 300 in a vertical direction to pick up the die 22 and an inverting driving unit 400 for inverting the non-contact picker 300 to invert the die 22 so that a rear surface of the die 22 picked up by the non-contact picker 300 faces upward.

The die bonding module 500 may comprise a substrate stage 510 for supporting the substrate 30, a bonding head 520 for picking up the inverted die 22 from the non-contact picker 300 and bonding them on the substrate 30, and a head driving unit (not shown) for moving the bonding head 520 in the vertical and horizontal directions in order to pick up the die 22 and bond the die 22 on the substrate 30. As an example, the die pickup module 100 may further include a horizontal driving unit 420 for moving the die 22 to a position adjacent to the die bonding module 500, and the head driving unit may include a second vertical driving unit for moving the bonding head 520 in the vertical direction and a second horizontal driving unit for moving the bonding head 520 in the horizontal direction.

On the other hand, the rear surface of the die 22 inverted by the inverting driving unit 410 faces upward and the front surface faces downward, and the non-contact picker 300 may support the inverted die 22 in a non-contact state so as not to contact the front surface of the die 22. Although not shown in detail, the bonding head 520 may include a bonding tool (not shown) for vacuum adsorbing the rear surface of the inverted die 22, and the bonding tool may include a vacuum hole for vacuum adsorbing the rear surface of the inverted die 22. As described above, since the front surface of the die 22 can be picked up in a non-contact state and inverted, contamination of the front surface of the die 22 bonded on the substrate 30 can be sufficiently prevented.

Referring to FIG. 2, a support ring 112 for supporting the dicing tape 24 may be arranged on the wafer stage 110. For example, the support ring 112 may support the dicing tape 24 between the dies 22 and the mount frame 26. Further, clamps 114 for gripping the mount frame 26 may be arranged on the wafer stage 110. The clamps 114 may be moved downward by a clamp driving unit (not shown), thereby the dicing tape 24 can be sufficiently expanded to facilitate pick up of the dies 22.

A die ejector 200 for separating the dies 22 from the dicing tape 24 may be arranged under the dicing tape 24 supported on the wafer stage 110. For example, the die ejector 200 may partially separate the die 22 from the dicing tape 24 by raising the die 22 to be picked up by using the ejector members 210 (see FIG. 7). After the die 22 is raised, the non-contact picker 300 descends to support the die 22 in a non-contact manner. After the die 22 is supported by the non-contact picker 300, the ejector members 210 can descend, thereby the die 22 can be completely separated from the dicing tape 24.

FIG. 3 is a schematic cross-sectional view for describing an example of the non-contact picker shown in FIG. 2.

Referring to FIG. 3, the non-contact picker 300 may include a vacuum chuck 320 and an ultrasonic vibration unit 310 for maintaining the die 22 to be picked up in a non-contact state using ultrasonic vibration. The vacuum chuck 320 may be mounted at one end of the ultrasonic vibration unit 310 and provide suction force to the die 22 using vacuum pressure. The ultrasonic vibration unit 310 utilizes the periodic air compression effect of ultrasonic vibration to provide repulsive force to push the die 22 from the die supporting surface 322 of the vacuum chuck 320 (the lower surface of the vacuum chuck 320 as shown). As an example, the vacuum chuck 320 may be ultrasonically vibrated by the ultrasonic vibration unit 310, and the die 22 may be supported in a non-contact state as to the vacuum chuck 320, that is, a state, in which spaced apart from the die supporting surface 322 by a predetermined distance, by the repulsive force generated by the vibration unit and the suction force by the vacuum pressure.

As an example, although not shown in detail, the ultrasonic vibration unit 310 may include a pair of piezoelectric elements, and an alternating voltage may be applied to the piezoelectric elements to generate ultrasonic vibration. The ultrasonic vibration generated by the ultrasonic vibration unit 310 may be transmitted to the vacuum chuck 320, and in this case, the vacuum chuck 320 may function as a vibration plate. The vacuum chuck 320 may include a plurality of vacuum holes 324 for generating the suction force, and the magnitude and frequency of the alternating voltage and the vacuum pressure applied to the vacuum holes 324 can be appropriately adjusted in consideration of the weight of the die 22 so that the die 22 is maintained in a non-contact state.

According to an embodiment of the present invention, the ultrasonic vibration unit 310 may be mounted in the central portion of the vacuum chuck 320, and as shown, the vacuum holes 324 may be connected to a vacuum pump (not shown) through the vacuum line 326 passing through the ultrasonic vibration unit 310.

FIG. 4 is a schematic cross-sectional view for describing another example of the non-contact picker shown in FIG. 2.

Referring to FIG. 4, the non-contact picker 300 may include a Bernoulli chuck 330 and an ultrasonic vibration unit 312 for maintaining the die 22 to be picked up in a non-contact state using ultrasonic vibration. The Bernoulli chuck 330 may be mounted at one end of the ultrasonic vibration unit 312 and form a flow of air on the die 22 and can provide suction force to the die 22 using negative pressure generated by the flow of air.

The Bernoulli chuck 330 may have an air injection nozzle 332 for forming the flow of air and a plurality of vacuum holes 334 for sucking air injected from the air injection nozzle 332. As an example, the ultrasonic vibration unit 312 may be mounted in a central portion of the Bernoulli chuck 330, and as shown, the air injection nozzle 332 may be connected to an air supplying unit (not shown) for supplying the air through the air line 336 passing through the ultrasonic vibration unit 312.

In particular, the Bernoulli chuck 330 may have a die supporting surface 338 facing the die 22, and the air injection nozzle 332 may be provided in the central portion of the die supporting surface 338. The air injection nozzle 332 may inject the air toward the edge portions of the die supporting surface 338 as shown, thereby the flow of air may occur radially between the die supporting surface 338 and the die 22. In this case, the vacuum holes 334 may be arranged at the edge portions of the die supporting surface 338.

FIG. 5 is a schematic cross-sectional view for describing another example of the non-contact picker shown in FIG. 2.

Referring to FIG. 5, the non-contact picker 300 may include an ultrasonic vibration unit 340 and a vacuum chuck 350. The ultrasonic vibration unit 340 may include an ultrasonic vibrator 342 for generating ultrasonic vibration, a horn 344 for amplifying and transmitting the ultrasonic vibration, and a vibration plate 346 connected to the horn 344 and vibrated by the ultrasonic vibration. The horn 344 may be configured in a substantially conical shape for amplification of ultrasonic vibration, and the vibration plate 346 may be mounted at an end of the horn 344.

The vacuum chuck 350 may be coupled to the ultrasonic vibration unit 340 and may be configured to surround the vibration plate 346. The vacuum chuck 350 may include a plurality of vacuum holes 352 for providing suction force, and the vacuum holes 352 may be arranged around the vibration plate 346. In this case, the die supporting surface may be configured with a lower surface of the vibration plate 346 facing the die 22 before being picked up and a lower surface of the vacuum chuck 350.

FIG. 6 is a schematic cross-sectional view for describing another example of the non-contact picker shown in FIG. 2.

Referring to FIG. 6, the non-contact picker 300 may include an ultrasonic vibration unit 360 and a Bernoulli chuck 370. The ultrasonic vibration unit 360 may include the ultrasonic vibrator 362 for generating ultrasonic vibration, the horn 364 for amplifying and transmitting the ultrasonic vibration, and the vibration plate 366 connected to the horn 364 and vibrated by ultrasonic vibration.

The Bernoulli chuck 370 may be coupled to the ultrasonic vibration unit 360 and may be configured to surround the vibration plate 366. As an example, the Bernoulli chuck 370 may include an air injection nozzle 372 for injecting air, and the air injection nozzle 372 may be provided in a lower central portion of the vibration plate 366. In addition, the Bernoulli chuck 370 may have vacuum holes 374 for sucking air injected from the air injection nozzle 372, and the vacuum holes 374 may be arranged around the vibration plate 366. In this case, the die supporting surface may be configured with a lower surface of the vibration plate 366 facing the die 22 before being picked up and a lower surface of the Bernoulli chuck 370.

On the other hand, when the die 22 is supported in a non-contact manner using the ultrasonic vibration unit 310, 312, 340, 360 and the vacuum chuck 320, 350 or the Bernoulli chuck 330, 370, a supporting force may be generated even in a direction parallel to the die supporting surface due to the periodic air compression effect generated by the ultrasonic vibration units 310, 312, 340, and 360, thereby the fall of the die 22 can be prevented in the inverting process of the non-contact picker 300. Further, when the die supporting surface is positioned in the horizontal direction, that is, before and after inverting, the horizontal position of the die 22 can always be maintained constant on the die supporting surface, thereby the alignment of the bonding head 520 for the picking up the inverted die 22 can be made more easily. Further, the die 22 may be picked up only by ultrasonic vibration provided by the ultrasonic vibration units 310, 312, 340, 360. Since the air compression effect by the ultrasonic vibration can generate not only repulsive force but also attractive force, non-contact pickup of the die 22 can be possible by only the ultrasonic vibration units 310, 312, 340, 360 through structural design changes to the die supporting surface of the non-contact picker 300.

FIG. 7 is a schematic cross-sectional view for describing the die ejector shown in FIG. 2, and FIG. 8 is a schematic plan view for describing the ejector members and flanges shown in FIG. 7, and FIG. 9 is a schematic plan view for describing a driving head shown in FIG. 7.

Referring to FIGS. 7 to 9, the die ejector 200 may be in close contact with the lower surface of the dicing tape 24, and may include the ejector members 210, 210a, 210b, 210c arranged in a telescope shape, and an ejector driving unit 220 which simultaneously raises the ejector members 210 and sequentially descends the ejector members 210 one by one from the outside to the inside. For example, the ejector driving unit 220 may include the disk-shaped flanges 222 222a, 222b, 222c that are formed in a lower end portion of the ejector members 210 in the horizontal direction respectively, arranged in the vertical direction, and have a diameter gradually increasing upward, a driving head 224 that is arranged in the lower portion of the flanges 222 and has a circular ring shaped upper surfaces respectively facing the lower surfaces of the flanges 222, a head driving unit 226 for rotating the driving head 224 and cam followers 234 that is mounted in the lower portion of the flanges 222 and placed on the upper surfaces of the driving head 224. In particular, the upper surfaces of the driving head 224 may include first inclined surfaces 224b for simultaneous raise of the ejector members 210 and second inclined surfaces 224d for sequential descend of the ejector members 210.

Further, the die ejector 200 may include a hood 240 having an opening 244, into which the ejector members 210 are inserted, and vacuum holes 246 for vacuum adsorbing the dicing tape 24, and a cylinder-shaped ejector body 250 coupled to a lower portion of the hood 240 and having a closed lower portion. The hood 240 may include an upper disk 242, in which the openings 244 and vacuum holes 246 are formed, and a hood body 248 in a circular tube shape coupled to the upper disk 242. Although not shown, a vacuum pump (not shown) may be connected to the ejector body 250, thereby a vacuum pressure for vacuum adsorbing the dicing tape 24 250 can be provided inside the hood 240 and the ejector body. The opening 244 may have a square shape, and the vacuum holes 246 may be formed passing through around the opening 244 to vacuum adsorb the dicing tape 24.

The flanges 222 may be arranged within the hood 240, and the ejector members 210 may extend upward from the flanges 222 through the opening 244. The ejector members 210 may have a square tube shape and may be arranged in a telescope shape. In particular, the ejector members 210 may be arranged to be spaced apart from each other by a predetermined distance, which provides a vacuum pressure between the ejector members 210 and inside the innermost ejector member 210c so that the die 22 is partially separated from the dicing tape 24 by the vacuum pressure when the ejector members 210 are raised.

According to an embodiment of the present invention, the die ejector 200 may include stopper members 212 arranged between the ejector members to maintain a gap between the ejector members 210 and to prevent rotation of the ejector members 210. On the other hand, the outermost ejector member 210a may have a size smaller than that of the die 22, thereby when the ejector members 210 rise, the edge portion of the die 22 can be separated from the dicing tape 24. As shown, three ejector members 210*a*, 210*b*, and 210*c* are used, but the number of ejector members 210 may be variously changed.

Each of the flanges 222 may be formed in the lower portion of the ejector members 210 and may have a disk shape. As an example, as shown, the flanges 222 has a gradually increasing diameter from the lowermost flange 222*c* formed in the lower portion of the innermost ejector member 210*c* toward the uppermost flange 222*a* formed in the lower portion of the outermost ejector member 210*a* and can be stacked in a vertical direction. The driving head 224 may have a stepped recess corresponding to the flanges 222, and upper surfaces of the driving head 224 may each have a circular ring shape.

According to an embodiment of the present invention, roller-shaped cam followers 234 may be mounted in the lower portion of the flanges 222, and the cam followers 234 may be placed on the upper surfaces of the driving head 224. For example, two cam followers 234 may be mounted on the flanges 222, respectively, as shown.

The upper surfaces of the driving head 224 may include first inclined surfaces 224*b* for raising the ejector members 210 and second inclined surfaces 224*d* for descending the ejector members 210, respectively. In addition, the upper surfaces of the driving head 224 may include first horizontal surfaces 224*a* arranged between lower portions of the first and second inclined surfaces 224*b* and 224*d* and second horizontal surfaces 224*c* arranged between the upper portions of the first and second inclined surfaces 224*b* and 224*d*.

The ejector driving unit 220 may include a head driving unit 226 for rotating the driving head 224, and the ejector members 210 may be elevated by rotation of the driving head 224. The head driving unit 226 may include a driving shaft 228 that passes through the lower portion of the ejector body 250 and is connected to the driving head 224. Further, the head driving unit 226 may include a motor 230 for rotating the driving shaft 228 and a power transmission device 232 for transmitting the rotational force of the motor 230 to the driving shaft 228.

The first and second inclined surfaces 224*b* and 224*d* of the driving head 224 may be configured so that all of the ejector members 210 simultaneously rise and sequentially descend one by one from the outermost ejector member 310*a* to the inside. For example, as shown, the first inclined surfaces 224*b* may be arranged at the same angle, and when the driving head 224 rotates clockwise, the ejector members 210 may be simultaneously raised. The second inclined surfaces 224*d* may be arranged to be spaced apart from the first inclined surfaces 224*b* by a predetermined angle in a clockwise direction. Accordingly, when the driving head 224 rotates in a clockwise direction, the ejector members 210 may be sequentially descended one by one from the outermost ejector member 210*a* to the inside.

Meanwhile, the driving head 224 may include a permanent magnet 236 that provides a magnetic force so that the cam followers 234 are in close contact with the upper surfaces of the driving head 224. Accordingly, the ejector members 210 may be elevated along the first and second inclined surfaces 224*b* and 224*d* by the rotation of the driving head 224. As an example, a circular ring-shaped permanent magnet 236 may be embedded in the driving head 224.

Although not shown, different from the above, according to another embodiment of the present invention, the ejector members 210 may be elevated by separate ejector driving units (not shown), respectively. For example, the ejector driving units may be respectively configured using a linear driving device including a motor and a linear motion guide, or may be configured using pneumatic cylinders differently.

FIGS. 10 to 14 are schematic diagrams for describing a method of picking up a die using the non-contact picker and die ejector shown in FIG. 2.

Referring to FIG. 10, the die ejector 200 may be positioned in the lower portion of the die 22 to be picked up. In this case, the cam followers 234 may be positioned on the first horizontal surfaces 224*a* of the driving head 224, thereby the ejector members 210 may all be in a descended state. In the hood 240, vacuum may be provided to vacuum adsorb the dicing tape 24 on the hood 240 and the ejector members 210, and the vacuum may be transmitted to the vacuum hole 246 as well as between the ejector members 210 and inside the innermost ejector member 112*c*.

Referring to FIG. 11, the driving head 224 may be rotated by a predetermined angle in the clockwise direction, thereby the cam followers 234 may be moved on the second horizontal surfaces 224*c* by passing through the first inclined surfaces 224*b* of the driving head 224. As a result, all of the ejector members 210 may be simultaneously raised so as to protrude from the hood 240, thereby the die 22 may be raised. In this case, portions of the die 22 except for portions supported by the ejector members 210 may be separated from the dicing tape 24.

Subsequently, the non-contact picker 300 may be descended by the vertical driving unit 400 to a position spaced apart from the front surface of the die 22 by a predetermined distance, and the die 22 may be supported in a non-contact state by the repulsive force generated by the ultrasonic vibration unit 310, 312, 340, 360 and the suction force generated by the vacuum chuck 320, 350 and the Bernoulli chuck 330 and 370.

Referring to FIGS. 12 to 14, the ejector members 210 may be sequentially descended one by one from the outermost ejector member 210*a* to the inside by rotation of the driving head 224, thereby the die 22 can be completely separated from the dicing tape 24. Specifically, the cam followers 234 may be moved onto the first horizontal surfaces 224*a* by passing through the second inclined surfaces 224*d* of the driving head 224 by rotation of the driving head 224, thereby the ejector members 210 may be sequentially descended one by one from the outside to the inside.

On the other hand, although not shown, in order to reduce the attachment area between the die 22 and the dicing tape 24 in a state where the die 22 is raised, a plurality of ejector pins (not shown) may be provided on the upper surfaces of the ejector members 210. In this case, since the adhesive force between the die 22 and the dicing tape 24 can be sufficiently reduced by the ejector pins in a state where the ejector members 210 are raised, the die 22 can be more easily separated from the dicing tape 24 when the ejector members 210 are descended.

As described above, after the die 22 is completely separated from the dicing tape 24, the vertical driving unit 400 may raise the non-contact picker 300, and the inverting driving unit 410 may invert the non-contact picker 300. Subsequently, the horizontal driving unit 420 may move the non-contact picker 300 to a position adjacent to the die bonding module 500, and the bonding head 520 may pick up the inverted die 22 and bond it on the substrate 30.

According to the embodiments of the present invention as described above, the non-contact picker 300 may pick up the die 22 in a non-contact manner by using the repulsive force provided by the ultrasonic vibration unit 310, 312, 340, 360 and the suction force provided by the vacuum chuck 320, 350 or the Bernoulli chuck 330, 370, and then the inverting driving unit 410 may invert the picked up die 22. The bonding head 520 may pick up the rear surface of the inverted die 22 by vacuum adsorption, and may perform a bonding step such that the front surface of the die 22 is attached onto the substrate 30. By picking up the die 22 in a non-contact manner as described above, contamination of the front surface portion of the die 22 can be prevented, and thus bonding failure due to contamination of the front surface portion of the die 22 or electrical defects between the electrode pads due to contamination can be sufficiently prevented.

Although described above with reference to the preferred embodiments of the present invention, it could be understood that those skilled in the art will variously modify and change the present invention within the scope not departing from the spirit and scope of the present invention recited in the following claims.

[Reference Numeral]

| | |
|---|---|
| 10: die bonding apparatus | 20: wafer |
| 22: die | 24: dicing tape |
| 100: die pickup module | 110: wafer stage |
| 200: die ejector | 210: ejector member |
| 220: ejector driving unit | 222: flange |
| 224: driving head | 226: head driving unit |
| 234: cam follower | 236: permanent magnet |
| 240: hood | 244: opening |
| 246: vacuum hole | 250: ejector body |
| 300: non-contact picker | 310: ultrasonic vibration unit |
| 320: vacuum chuck | 330: Bernoulli chuck |
| 400: vertical driving unit | 410: inverting driving unit |
| 500: die bonding module | 510: substrate stage |
| 520: bonding head | |

What is claimed is:

1. A die pickup module comprising:
a wafer stage for supporting a wafer including dies attached on a dicing tape;
a die ejector arranged under the dicing tape and for separating a die to be picked up from the dicing tape;
a non-contact picker for picking up the die in a non-contact manner so as not to contact a front surface of the die;
a vertical driving unit for moving the non-contact picker in a vertical direction to pick up the die; and
an inverting driving unit for inverting the non-contact picker to invert a die picked up by the non-contact picker, the non-contact picker maintaining the die in the non-contact manner so as not to contact the front surface of the die when inverted by the inverting driving unit.

2. The die pickup module of claim 1,
wherein the non-contact picker includes an ultrasonic vibration unit for maintaining the die in a non-contact state using ultrasonic vibration.

3. The die pickup module of claim 1,
wherein the non-contact picker includes,
an ultrasonic vibration unit for providing repulsive force to push the die using ultrasonic vibration, and
a vacuum chuck for providing suction force to the die using a vacuum pressure so that the die is maintained in a non-contact state.

4. The die pickup module of claim 1,
wherein the non-contact picker includes,
an ultrasonic vibration unit for providing repulsive force to push the die using ultrasonic vibration, and
a Bernoulli chuck for forming a flow of air on the die so as to maintain the die in a non-contact state and providing suction force to the die using negative pressure generated by the flow of air.

5. The die pickup module of claim 2,
wherein the ultrasonic vibration unit includes,
an ultrasonic vibrator for generating the ultrasonic vibration,
a horn for transmitting the ultrasonic vibration, and
a vibration plate connected to the horn and vibrated by the ultrasonic vibration.

6. The die pickup module of claim 3,
wherein the vacuum chuck is coupled to an end of the ultrasonic vibration unit and has vacuum holes for forming the suction force,
wherein the vacuum holes are connected to a vacuum pump through a vacuum line passing through the ultrasonic vibration unit.

7. The die pickup module of claim 4,
wherein the Bernoulli chuck is coupled to an end of the ultrasonic vibration unit and has an air injection nozzle for forming the flow of air and vacuum holes for sucking air injected from the air injection nozzle,
wherein the air injection nozzle is connected to an air supplying unit for supplying the air through an air line passing through the ultrasonic vibration unit.

8. The die pickup module of claim 1,
wherein the die ejector includes,
ejector members arranged in a telescope shape, and
an ejector driving unit for simultaneously raising the ejector members and sequentially descending the ejector members one by one from outside to inside.

9. The die pickup module of claim 8,
wherein the ejector driving unit includes,
disc-shaped flanges each formed in a horizontal direction in a lower end portion of the ejector members, arranged in a vertical direction, and having a diameter gradually increasing upward,
a driving head arranged in a lower portion of the flanges and having a circular ring shaped upper surfaces respectively facing lower surfaces of the flanges,
a head driving unit for rotating the driving head, and
cam followers mounted in a lower portion of the flanges and placed on upper surfaces of the driving head,
wherein the upper surfaces of the driving head have first inclined surfaces for simultaneous rise of the ejector members and second inclined surfaces for sequential descend of the ejector members.

10. The die pickup module of claim 9,
wherein the driving head includes a permanent magnet for providing a magnetic force so that the cam followers are in close contact with upper surfaces of the driving head.

11. The die pickup module of claim 8,
wherein the die ejector further includes a stopper member for maintaining a gap between the ejector members.

12. The die pickup module of claim 8,
wherein the die ejector further includes,
a hood having an opening, into which the ejector members are inserted, and vacuum holes for vacuum adsorbing the dicing tape, and
an ejector body coupled to the hood and in a cylinder shape with a closed lower portion.

13. A die bonding apparatus comprising:
a die pickup module for picking up a die to be picked up from a wafer including dies attached on a dicing tape and inverting the picked up die; and a die bonding module for bonding a die inverted by the die pickup module on a substrate, wherein the die pickup module includes, a wafer stage for supporting the wafer;

a die ejector arranged under the dicing tape and for separating the die from the dicing tape;

a non-contact picker for picking up the die in a non-contact manner so as not to contact a front surface of the die;

a vertical driving unit for moving the non-contact picker in a vertical direction to pick up the die; and an inverting driving unit for inverting the non-contact picker to invert the die so that a rear surface of the die picked up by the non-contact picker faces upward, the non-contact picker maintaining the die in the non-contact manner so as not to contact the front surface of the die when inverted by the inverting driving unit.

14. The die pickup module of claim 3, wherein the ultrasonic vibration unit includes, an ultrasonic vibrator for generating the ultrasonic vibration, a horn for transmitting the ultrasonic vibration, and a vibration plate connected to the horn and vibrated by the ultrasonic vibration.

15. The die pickup module of claim 4, wherein the ultrasonic vibration unit includes, an ultrasonic vibrator for generating the ultrasonic vibration, a horn for transmitting the ultrasonic vibration, and a vibration plate connected to the horn and vibrated by the ultrasonic vibration.

\* \* \* \* \*